United States Patent
Xie et al.

(10) Patent No.: US 11,302,794 B2
(45) Date of Patent: Apr. 12, 2022

(54) FINFET WITH DUAL WORK FUNCTION METAL

(71) Applicant: INTERNATIONAL BUSINESS MACHINES CORPORATION, Armonk, NY (US)

(72) Inventors: Ruilong Xie, Niskayuna, NY (US); Takashi Ando, Eastchester, NY (US); Alexander Reznicek, Troy, NY (US); Pouya Hashemi, Purchase, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/821,903

(22) Filed: Mar. 17, 2020

(65) Prior Publication Data

US 2021/0296463 A1    Sep. 23, 2021

(51) Int. Cl.
*H01L 29/49*    (2006.01)
*H01L 29/78*    (2006.01)
*H01L 29/66*    (2006.01)
*H01L 21/28*    (2006.01)

(52) U.S. Cl.
CPC .... *H01L 29/4983* (2013.01); *H01L 21/28088* (2013.01); *H01L 29/4966* (2013.01); *H01L 29/66545* (2013.01); *H01L 29/66795* (2013.01); *H01L 29/7851* (2013.01)

(58) Field of Classification Search
CPC .......... H01L 29/4983; H01L 21/28088; H01L 29/4966; H01L 29/66545; H01L 29/66795; H01L 29/7851
See application file for complete search history.

(56) References Cited

U.S. PATENT DOCUMENTS

| | | | |
|---|---|---|---|
| 8,008,144 B2 * | 8/2011 | Ananthan | H01L 29/7827 438/199 |
| 8,012,828 B2 | 9/2011 | Min | |
| 8,299,530 B2 | 10/2012 | Pei | |
| 9,356,027 B1 | 5/2016 | Cheng | |
| 9,484,427 B2 | 11/2016 | Ando | |

(Continued)

FOREIGN PATENT DOCUMENTS

CN    1938858 A  *  3/2007  ......... H01L 29/4958

OTHER PUBLICATIONS

Woo, "DRAm Challenging history and future," in IEDM Short Course 2: It's All About Memory, Not Logic!!!. 2018.

(Continued)

*Primary Examiner* — Douglas W Owens
(74) *Attorney, Agent, or Firm* — L. Jeffrey Kelly

(57) ABSTRACT

An embodiment of the invention may include a method for of forming a semiconductor device and the resulting device. The method may include forming a gate dielectric on a gate region of a substrate. The method may include forming an inner dummy gate on a first portion of the gate dielectric. The method may include forming an outer dummy gate adjacent to the inner dummy gate on a second portion of the gate dielectric. The method may include forming spacers adjacent to the outer dummy gate. The method may include removing the outer dummy gate and depositing a first work function metal. The method may include removing the inner dummy gate and depositing a second work function metal.

20 Claims, 8 Drawing Sheets

(56) References Cited

U.S. PATENT DOCUMENTS

| | | | |
|---|---|---|---|
| 9,515,164 B2 | 12/2016 | Ando | |
| 10,236,217 B1 | 3/2019 | Ando | |
| 10,249,533 B1 | 4/2019 | Shearer | |
| 10,381,273 B1 | 8/2019 | Cheng | |
| 2012/0223390 A1* | 9/2012 | Liang | H01L 29/66356 257/369 |
| 2016/0087069 A1* | 3/2016 | Oda | H01L 27/1203 257/77 |
| 2017/0133219 A1* | 5/2017 | Tak | H01L 21/28088 |
| 2017/0194481 A1* | 7/2017 | He | H01L 21/31116 |
| 2017/0221708 A1 | 8/2017 | Bergendahl | |
| 2017/0294436 A1* | 10/2017 | Chang | H01L 29/66795 |
| 2019/0035694 A1* | 1/2019 | More | H01L 21/02164 |
| 2019/0165125 A1* | 5/2019 | Lai | H01L 29/66795 |
| 2019/0181258 A1* | 6/2019 | Zhao | H01L 29/66545 |
| 2019/0333769 A1* | 10/2019 | Chen | H01L 29/4966 |
| 2020/0118889 A1* | 4/2020 | Bao | H01L 27/0922 |
| 2020/0135589 A1* | 4/2020 | Lee | H01L 21/28176 |
| 2021/0125877 A1* | 4/2021 | Hsu | H01L 29/66795 |
| 2021/0202699 A1* | 7/2021 | Hsu | H01L 29/0847 |

OTHER PUBLICATIONS

Hinkle et al., "Dipole controlled metal gate with hybrid low resistivity cladding for gate-last CMOS with low Vt," Symposium on VLSI Technology, 2010, pp. 183-184.

\* cited by examiner

FINFET WITH DUAL WORK FUNCTION METAL

BACKGROUND

The present invention relates to semiconductor fabrication, and more specifically, to MOSFET gate manufacturing techniques.

FETs are commonly employed in electronic circuit applications. FETs may include a source region and a drain region spaced apart by a semiconductor channel region. Metal-oxide-semiconductor field-effect transistor (MOSFET) are a common type of FET. In planar FETs, the semiconductor channel region may be a semiconductor substrate. In FinFETs, the semiconductor channel region may be a semiconductor fin. A gate, potentially including a gate dielectric layer, a work function metal layer, and a metal electrode, may be formed above the channel region. By applying voltage to the gate, the conductivity of the channel region may increase and allow current to flow from the source region to the drain region.

FinFETs may provide solutions to field effect transistor (FET) scaling problems at, and below, the 22 nm node. FinFET structures include at least one narrow semiconductor fin as the channel region of the FET and are gated on at least two sides of each of the at least one semiconductor fin. FinFETs including more than one fin may be referred to as multi-fin FinFETs. FinFETs may be formed on bulk substrates to reduce wafer cost and/or enable formation of certain devices in the bulk substrate.

BRIEF SUMMARY

An embodiment of the invention may include a method for of forming a semiconductor device. The method may include forming a gate dielectric on a gate region of a substrate. The method may include forming an inner dummy gate on a first portion of the gate dielectric. The method may include forming an outer dummy gate adjacent to the inner dummy gate on a second portion of the gate dielectric. The method may include forming spacers adjacent to the outer dummy gate. The method may include removing the outer dummy gate and depositing a first work function metal. The method may include removing the inner dummy gate and depositing a second work function metal.

An embodiment of the invention may include a semiconductor device. The semiconductor device may include a gate dielectric located on a substrate, wherein the gate dielectric defines a gate region of the substrate. The semiconductor device may include a first work function metal located on a first portion of the gate dielectric. The semiconductor device may include a second work function metal located on a second portion of the gate dielectric, wherein the first work function metal sandwiches the second work function metal.

Figure 1A:
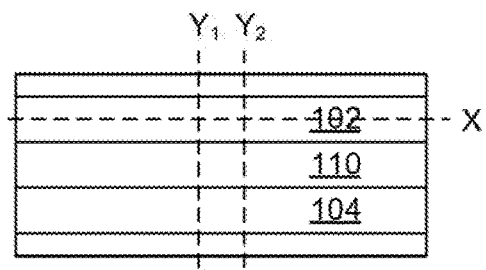
FIG. 1a depicts a top view of fins on a substrate, according to an example embodiment.
Figure 1B:
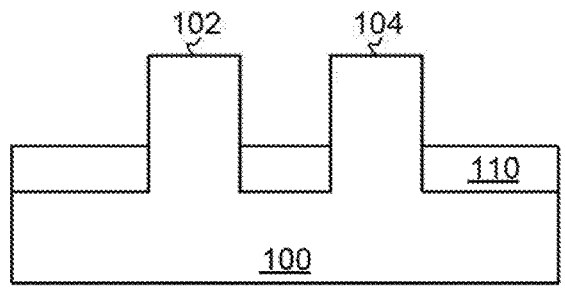
FIG. 1b depicts a cross-sectional view along the $Y_1$ axis of FIG. 1a of fins on a substrate, according to an example embodiment.
Figure 1C:
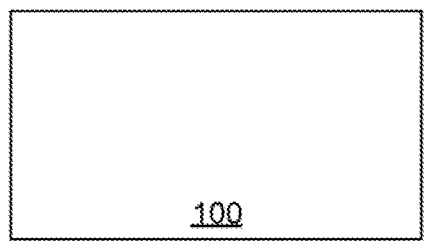
FIG. 1c depicts a cross-sectional view along the X axis of FIG. 1a of fins on a substrate, according to an example embodiment.
Figure 1D:
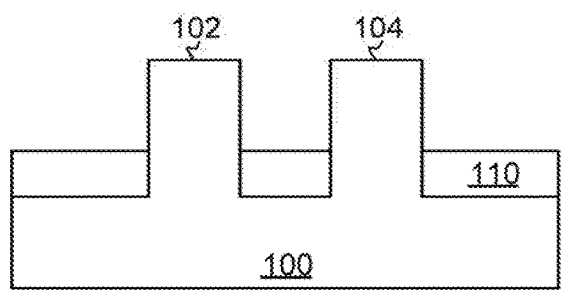
FIG. 1d depicts a cross-sectional view along the $Y_2$ axis of FIG. 1a of fins on a substrate, according to an example embodiment.
Figure 2A:
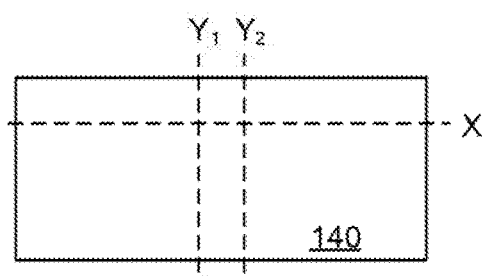
FIG. 2a depicts a top view following deposition of a gate dielectric, an etch stop and a dummy layer, according to an example embodiment.
Figure 2B:
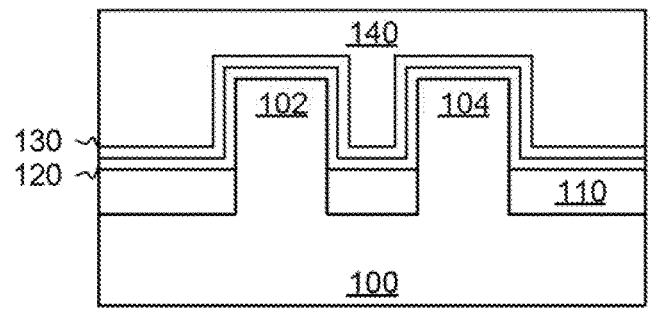
FIG. 2b depicts a cross-sectional view along the $Y_1$ axis of FIG. 2a following deposition of a gate dielectric, an etch stop and a dummy layer, according to an example embodiment.
Figure 2C:
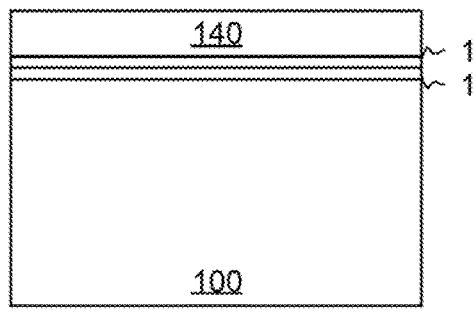
FIG. 2c depicts a cross-sectional view along the X axis of FIG. 2a following deposition of a gate dielectric, an etch stop and a dummy layer, according to an example embodiment.
Figure 2D:
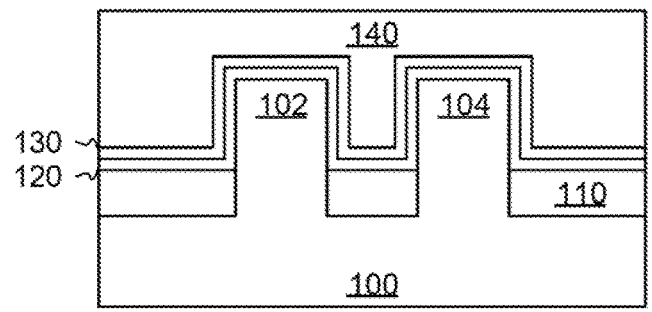
FIG. 2d depicts a cross-sectional view along the $Y_2$ axis of FIG. 2a following deposition of a gate dielectric, an etch stop and a dummy layer, according to an example embodiment.
Figure 3A:
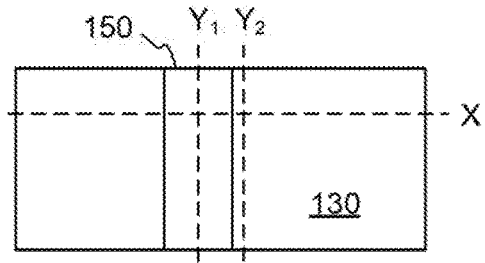
FIG. 3a depicts a top view following patterning a dummy inner gate, according to an example embodiment.
Figure 3B:
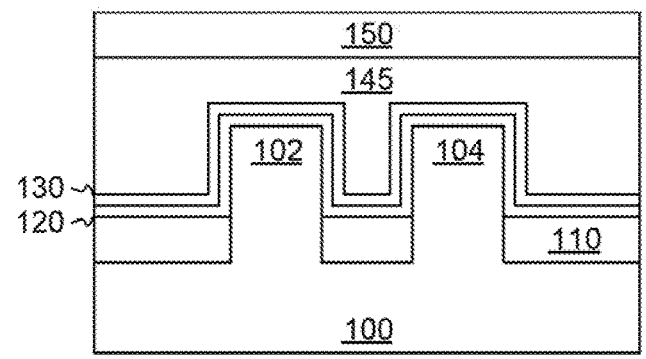
FIG. 3b depicts a cross-sectional view along the $Y_1$ axis of FIG. 3a following patterning a dummy inner gate, according to an example embodiment.
Figure 3C:
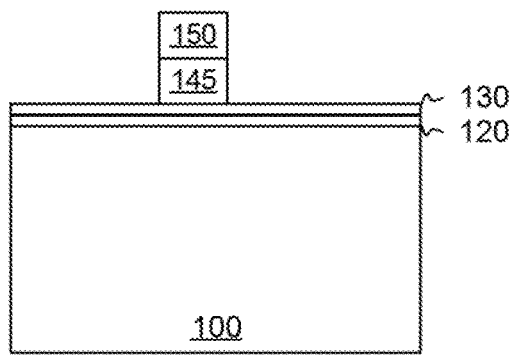
FIG. 3c depicts a cross-sectional view along the X axis of FIG. 3a following patterning a dummy inner gate, according to an example embodiment.
Figure 3D:
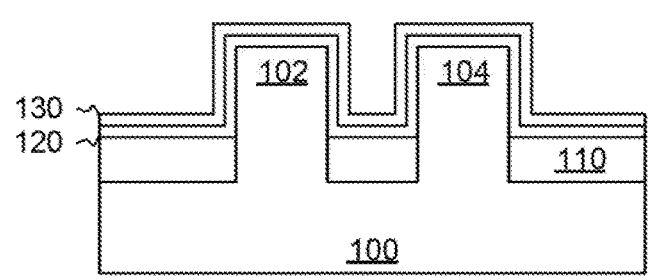
FIG. 3d depicts a cross-sectional view along the $Y_2$ axis of FIG. 3a following patterning a dummy inner gate, according to an example embodiment.
Figure 4A:
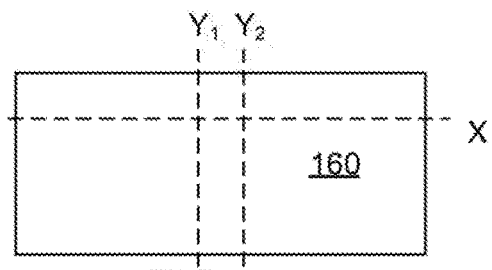
FIG. 4a depicts a top view following depositing an outer gate dummy layer, according to an example embodiment.
Figure 4B:
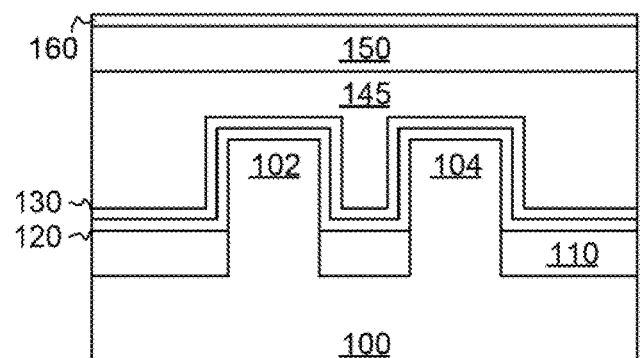
FIG. 4b depicts a cross-sectional view along the $Y_1$ axis of FIG. 4a following depositing an outer gate dummy layer, according to an example embodiment.
Figure 4C:
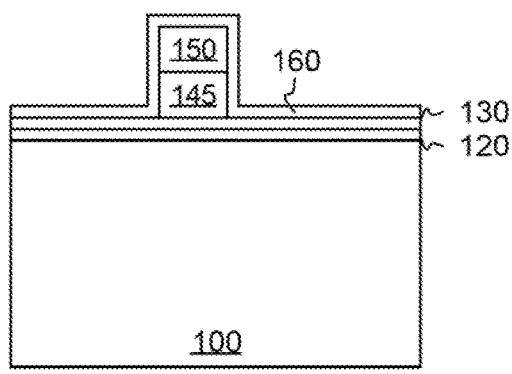
FIG. 4c depicts a cross-sectional view along the X axis of FIG. 4a following depositing an outer gate dummy layer, according to an example embodiment.
Figure 4D:
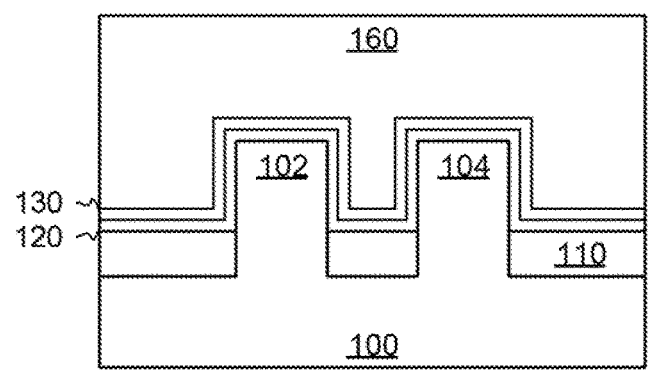
FIG. 4d depicts a cross-sectional view along the $Y_2$ axis of FIG. 4a following depositing an outer gate dummy layer, according to an example embodiment.
Figure 5A:
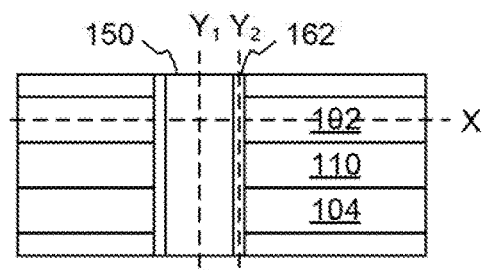
FIG. 5a depicts a top view following formation of the outer dummy gate, according to an example embodiment.
Figure 5B:
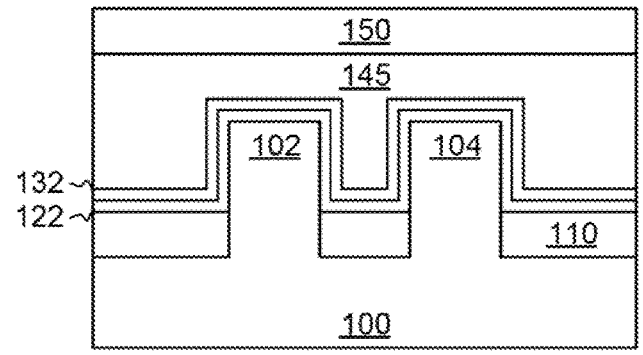
FIG. 5b depicts a cross-sectional view along the $Y_1$ axis of FIG. 5a following formation of the outer dummy gate, according to an example embodiment.
Figure 5C:
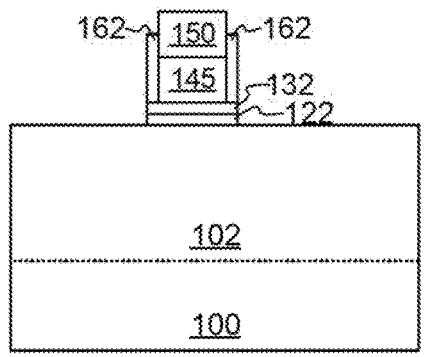
FIG. 5c depicts a cross-sectional view along the X axis of FIG. 5a following formation of the outer dummy gate, according to an example embodiment.
Figure 5D:
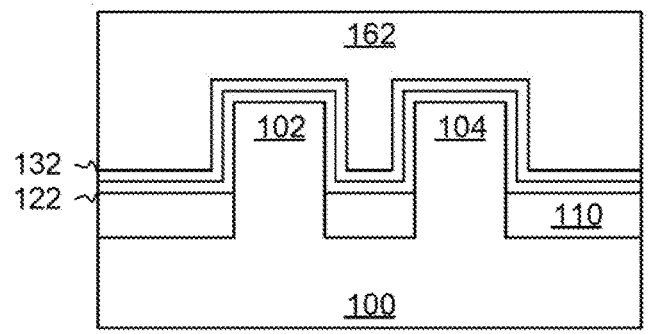
FIG. 5d depicts a cross-sectional view along the $Y_2$ axis of FIG. 5a following formation of the outer dummy gate, according to an example embodiment.
Figure 6A:
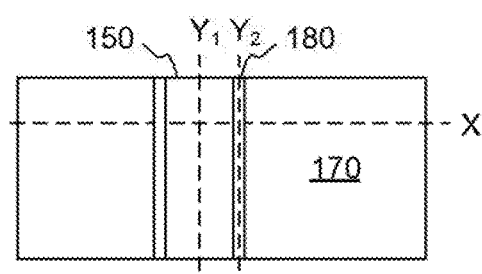
FIG. 6a depicts a top view following formation of a hardmask above the outer dummy gate, according to an example embodiment.
Figure 6B:
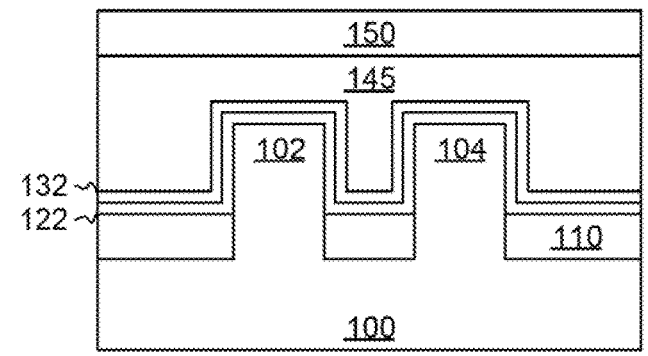
FIG. 6b depicts a cross-sectional view along the $Y_1$ axis of FIG. 6a following formation of a hardmask above the outer dummy gate, according to an example embodiment.
Figure 6C:
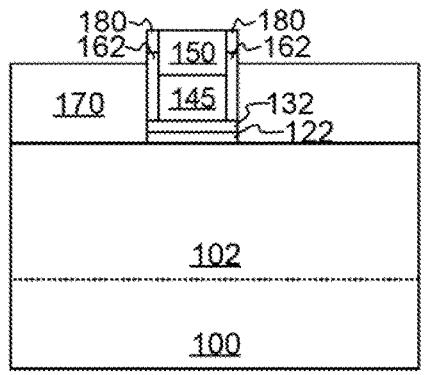
FIG. 6c depicts a cross-sectional view along the X axis of FIG. 6a following formation of a hardmask above the outer dummy gate, according to an example embodiment.
Figure 6D:
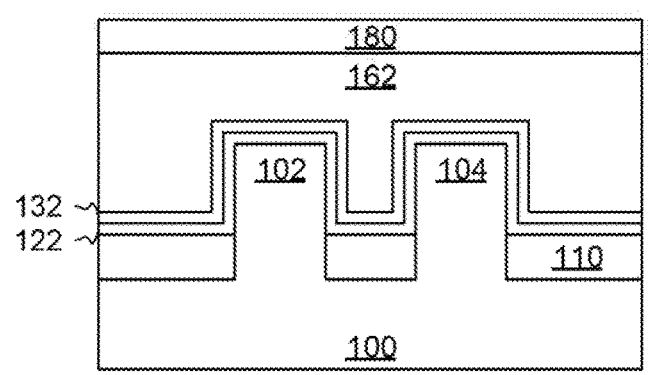
FIG. 6d depicts a cross-sectional view along the $Y_2$ axis of FIG. 6a following formation of a hardmask above the outer dummy gate, according to an example embodiment.
Figure 7A:
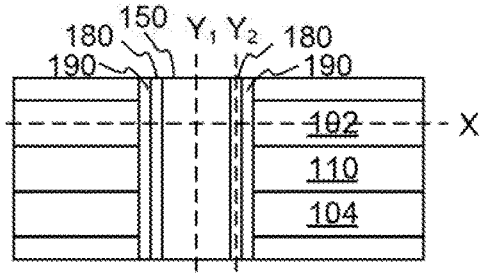
FIG. 7a depicts a top view following forming a gate dielectric, according to an example embodiment.
Figure 7B:
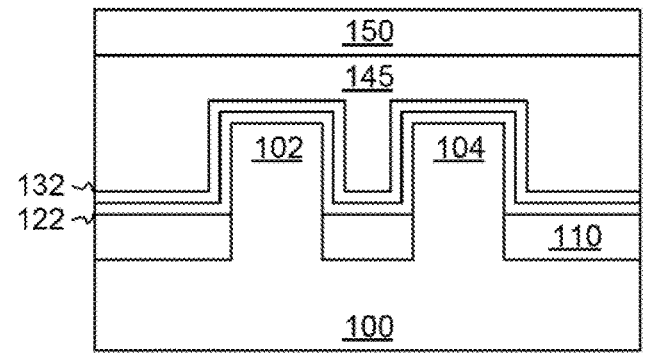
FIG. 7b depicts a cross-sectional view along the $Y_1$ axis of FIG. 7a following forming a gate dielectric, according to an example embodiment.
Figure 7C:
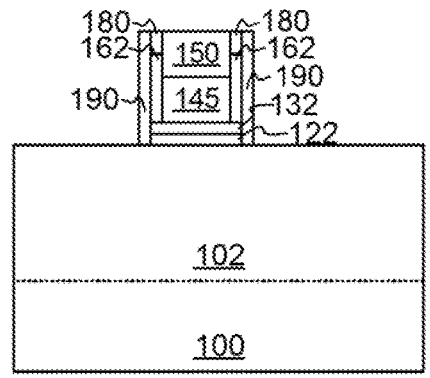
FIG. 7c depicts a cross-sectional view along the X axis of FIG. 7a following forming a gate dielectric, according to an example embodiment.
Figure 7D:
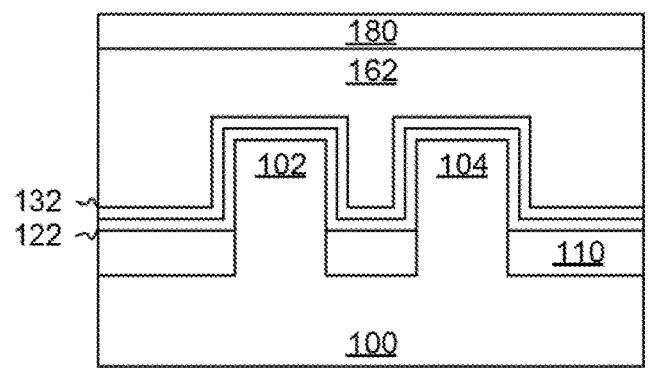
FIG. 7d depicts a cross-sectional view along the $Y_2$ axis of FIG. 7a following forming a gate dielectric, according to an example embodiment.
Figure 8A:
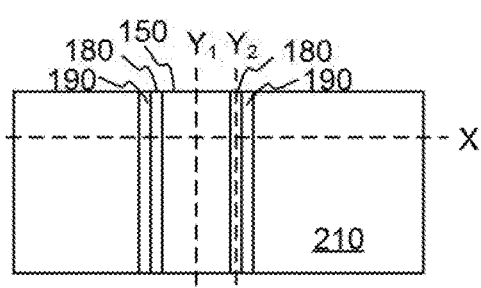
FIG. 8a depicts a top view following source/drain formation, according to an example embodiment.
Figure 8B:
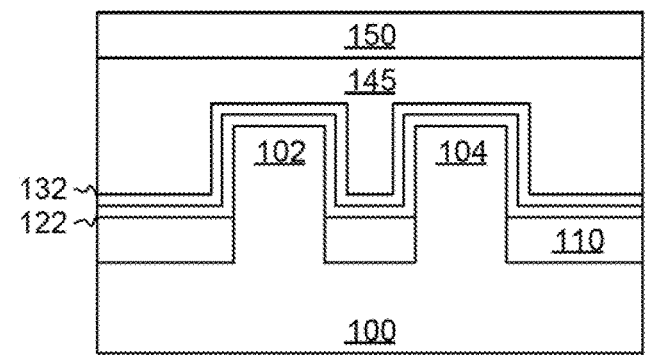
FIG. 8b depicts a cross-sectional view along the $Y_1$ axis of FIG. 8a following source/drain formation, according to an example embodiment.
Figure 8C:
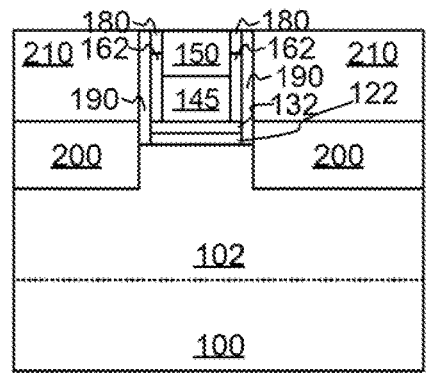
FIG. 8c depicts a cross-sectional view along the X axis of FIG. 8a following source/drain formation, according to an example embodiment.
Figure 8D:
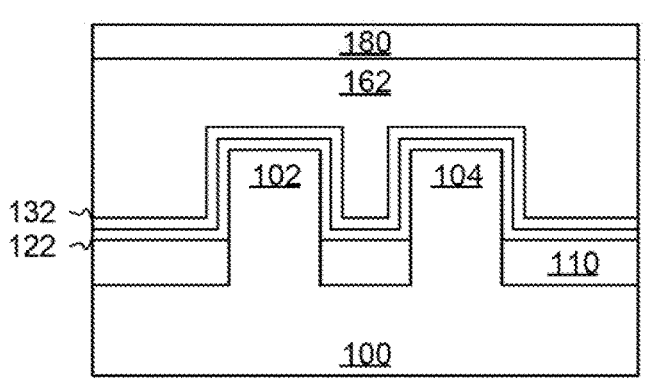
FIG. 8d depicts a cross-sectional view along the $Y_2$ axis of FIG. 8a following source/drain formation, according to an example embodiment.
Figure 9A:
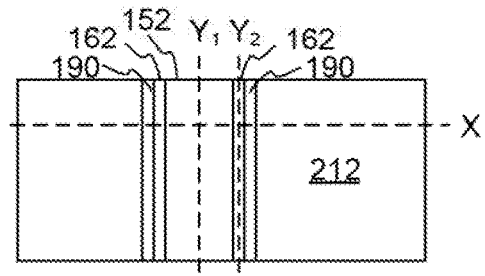
FIG. 9a depicts a top view following exposing the outer dummy gate, according to an example embodiment.
Figure 9B:
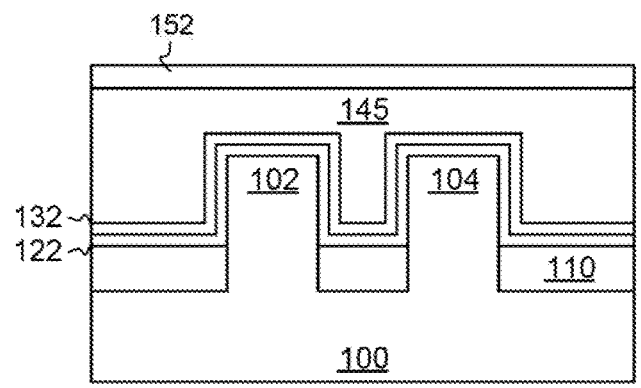
FIG. 9b depicts a cross-sectional view along the $Y_1$ axis of FIG. 9a following exposing the outer dummy gate, according to an example embodiment.
Figure 9C:
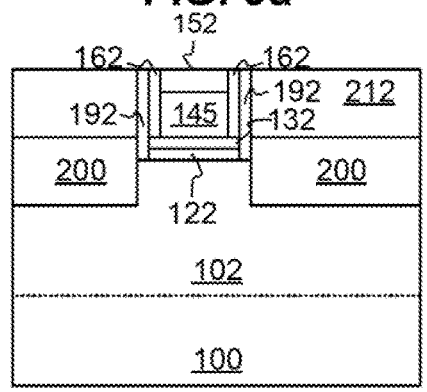
FIG. 9c depicts a cross-sectional view along the X axis of FIG. 9a following exposing the outer dummy gate, according to an example embodiment.
Figure 9D:
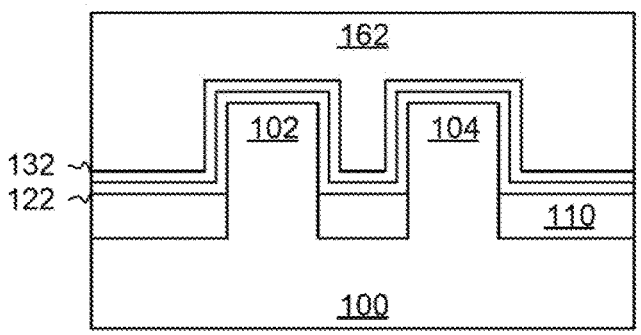
FIG. 9d depicts a cross-sectional view along the $Y_2$ axis of FIG. 9a following exposing the outer dummy gate, according to an example embodiment.
Figure 10A:
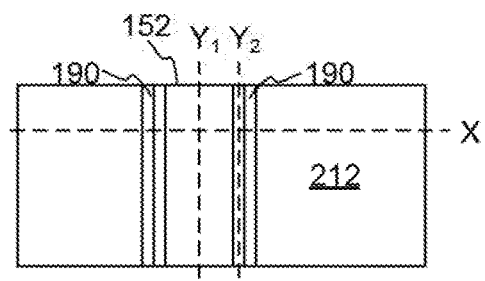
FIG. 10a depicts a top view following removing the outer dummy gate, according to an example embodiment.
Figure 10B:
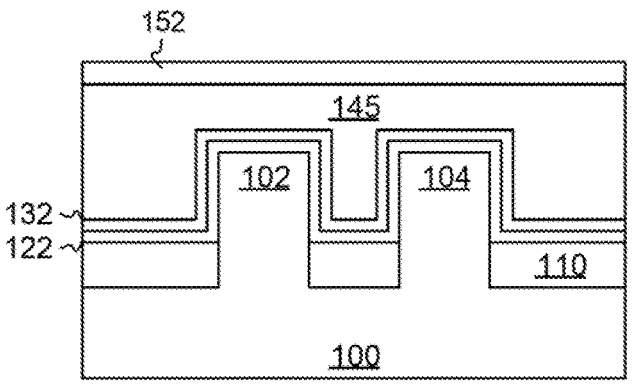
FIG. 10b depicts a cross-sectional view along the $Y_1$ axis of FIG. 10a following removing the outer dummy gate, according to an example embodiment.
Figure 10C:
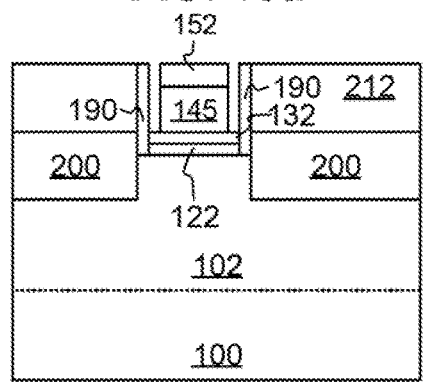
FIG. 10c depicts a cross-sectional view along the X axis of FIG. 10a following removing the outer dummy gate, according to an example embodiment.
Figure 10D:
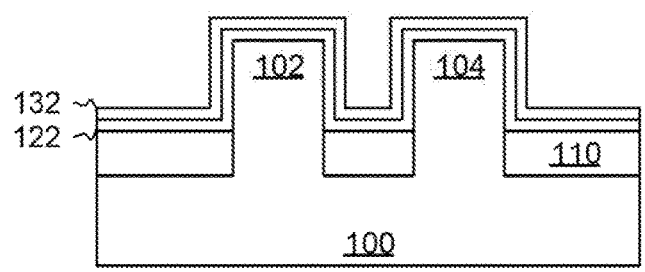
FIG. 10d depicts a cross-sectional view along the $Y_2$ axis of FIG. 10a following removing the outer dummy gate, according to an example embodiment.
Figure 11A:
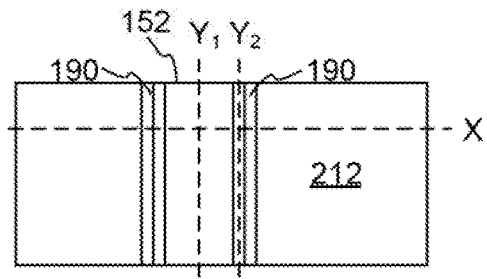
FIG. 11a depicts a top view following removing a portion of the etch stop, according to an example embodiment.
Figure 11B:
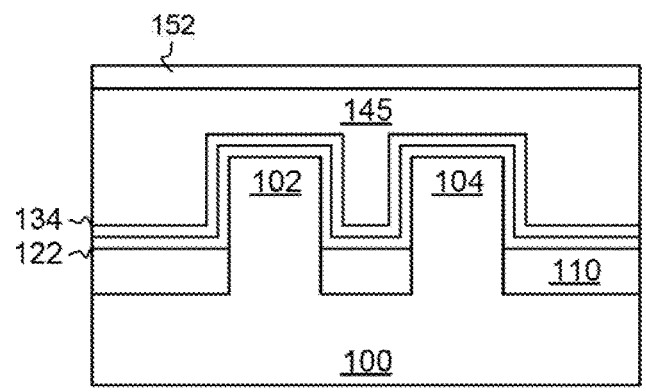
FIG. 11b depicts a cross-sectional view along the $Y_1$ axis of FIG. 11a following removing a portion of the etch stop, according to an example embodiment.
Figure 11C:
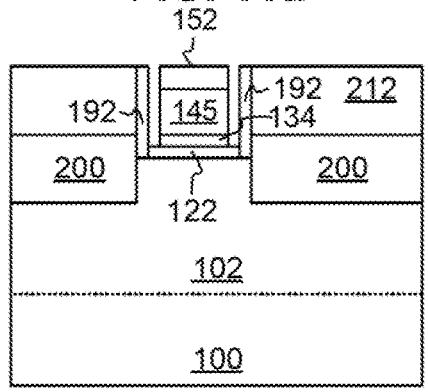
FIG. 11c depicts a cross-sectional view along the X axis of FIG. 11a following removing a portion of the etch stop, according to an example embodiment.
Figure 11D:
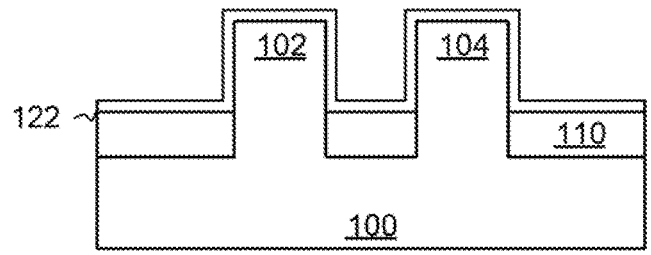
FIG. 11d depicts a cross-sectional view along the $Y_2$ axis of FIG. 11a following removing a portion of the etch stop, according to an example embodiment.
Figure 12A:
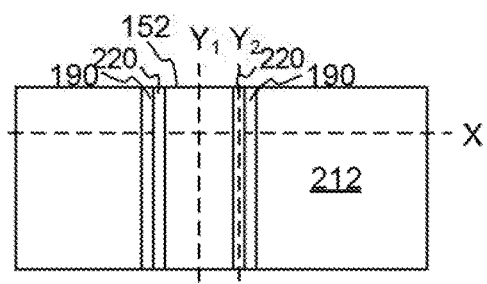
FIG. 12a depicts a top view following depositing a first workfunction metal, according to an example embodiment.
Figure 12B:
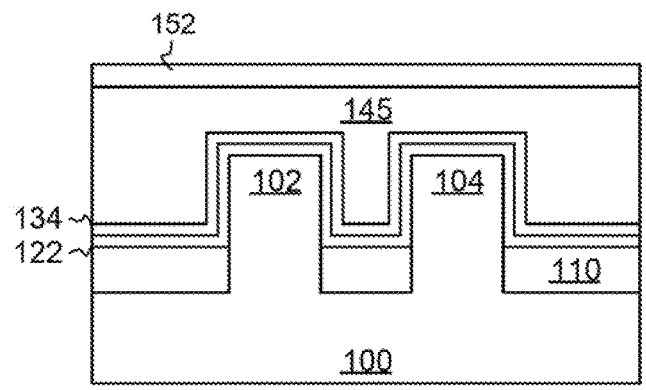
FIG. 12b depicts a cross-sectional view along the $Y_1$ axis of FIG. 12a following depositing a first workfunction metal, according to an example embodiment.
Figure 12C:
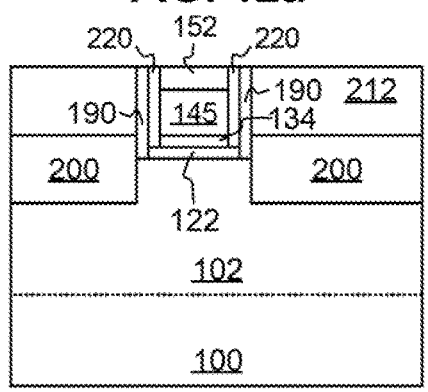
FIG. 12c depicts a cross-sectional view along the X axis of FIG. 12a following depositing a first workfunction metal, according to an example embodiment.
Figure 12D:
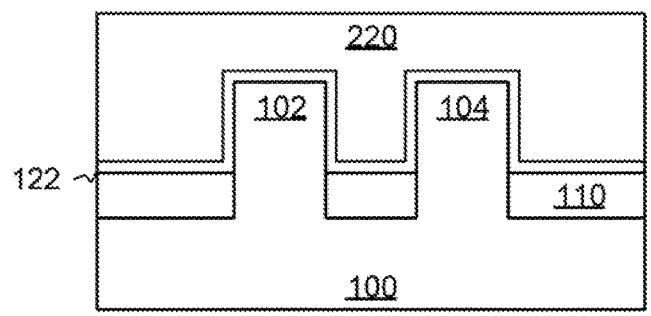
FIG. 12d depicts a cross-sectional view along the $Y_2$ axis of FIG. 12a following depositing a first workfunction metal, according to an example embodiment.
Figure 13A:
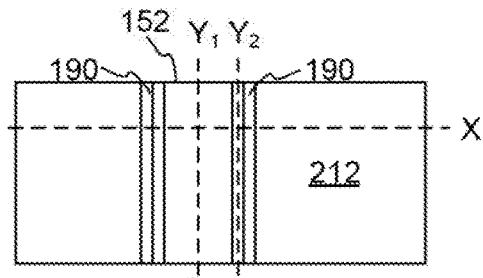
FIG. 13a depicts a top view following removing an inner dummy gate, according to an example embodiment.
Figure 13B:
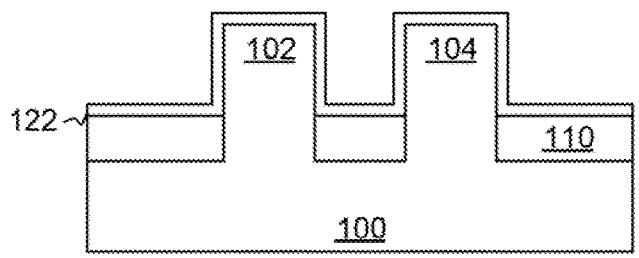
FIG. 13b depicts a cross-sectional view along the $Y_1$ axis of FIG. 13a following removing an inner dummy gate, according to an example embodiment.
Figure 13C:
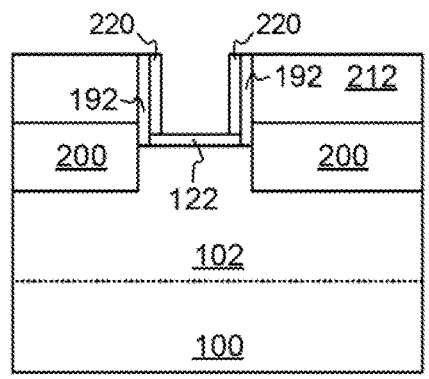
FIG. 13c depicts a cross-sectional view along the X axis of FIG. 13a following removing an inner dummy gate, according to an example embodiment.
Figure 13D:
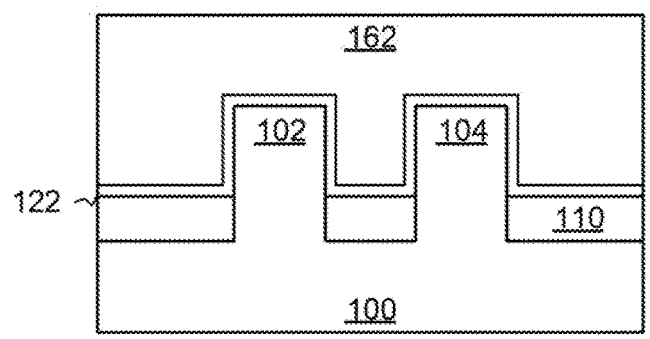
FIG. 13d depicts a cross-sectional view along the $Y_2$ axis of FIG. 13a following removing an inner dummy gate, according to an example embodiment.
Figure 14A:
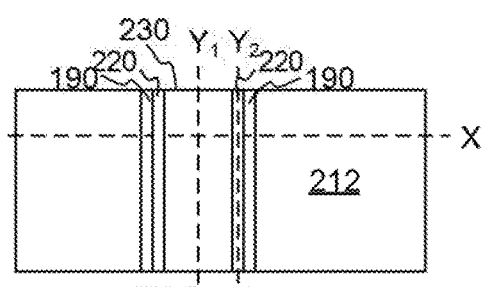
FIG. 14a depicts a top view following depositing a second workfunction metal, according to an example embodiment.
Figure 14B:
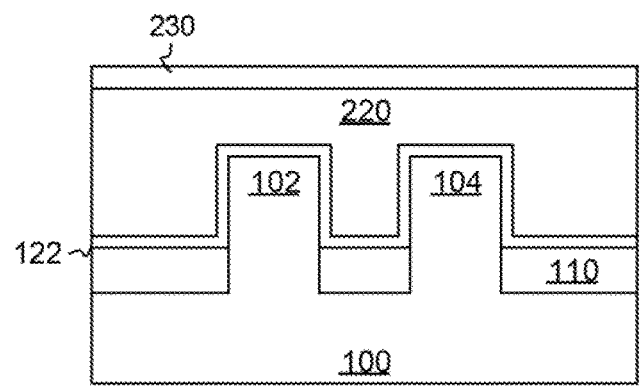
FIG. 14b depicts a cross-sectional view along the $Y_1$ axis of FIG. 14a following depositing a second workfunction metal, according to an example embodiment.
Figure 14C:
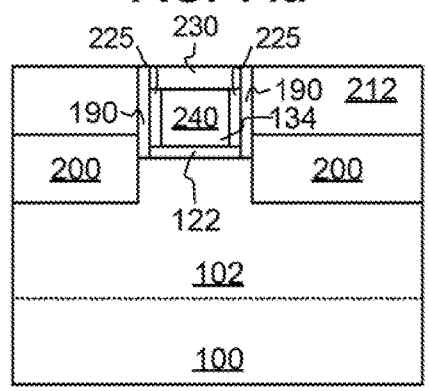
FIG. 14c depicts a cross-sectional view along the X axis of FIG. 14a following depositing a second workfunction metal, according to an example embodiment.
Figure 14D:
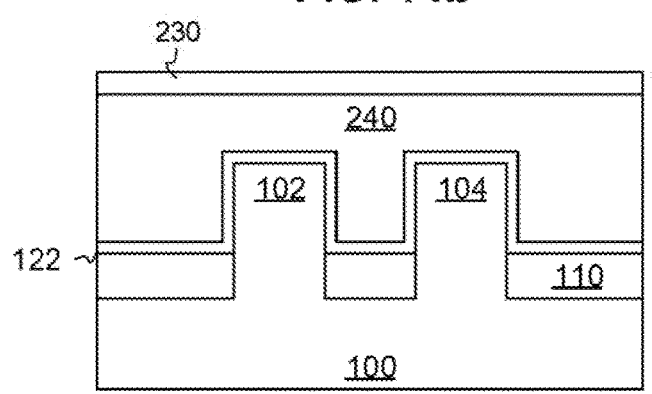
FIG. 14d depicts a cross-sectional view along the $Y_2$ axis of FIG. 14a following depositing a second workfunction metal, according to an example embodiment.

Elements of the figures are not necessarily to scale and are not intended to portray specific parameters of the invention. For clarity and ease of illustration, dimensions of elements may be exaggerated. The detailed description should be consulted for accurate dimensions. The drawings are intended to depict only typical embodiments of the invention, and therefore should not be considered as limiting the scope of the invention. In the drawings, like numbering represents like elements.

DETAILED DESCRIPTION

Exemplary embodiments now will be described more fully herein with reference to the accompanying drawings, in which exemplary embodiments are shown. This disclosure may, however, be embodied in many different forms and should not be construed as limited to the exemplary embodiments set forth herein. Rather, these exemplary embodiments are provided so that this disclosure will be thorough and complete and will convey the scope of this disclosure to those skilled in the art. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Gate-Induced Drain Leakage (GIDL) is a component of leakage from MOSFET devices. The effect of GIDL is more prevalent at higher VDD and lower gate voltage ($V_g$) of such devices. Traditionally, increased doping densities of the source/drain region of the MOSFET device was used to suppress such GIDL. However, GIDL worsens with scaled inversion layer thickness ($T_{inv}$), which is a byproduct of miniaturization of device components. Further, such miniaturization and device geometries make it increasingly difficult to rectify the losses through additional doping. By modifying the $T_{inv}$ near the source/drain of the MOSFET, the GIDL of such devices may be reduced.

Referring to FIG. 1a-1d, a first fin 102 and a second fin 104 are located on a substrate 100. An STI layer 110 may be located on the substrate 100 and isolate the first fin 102 and the second fin 104. According to an exemplary embodiment, substrate 100 is a bulk semiconductor wafer, such as a bulk silicon (Si), bulk germanium (Ge), and/or bulk III-V semiconductor wafer. Alternatively, substrate 100 can be a semiconductor-on-insulator (SOI) wafer. A SOI wafer includes a SOI layer separated from an underlying substrate by a buried insulator. When the buried insulator is an oxide it is referred to herein as a buried oxide or BOX. The SOI layer can include any suitable semiconductor, such as Si, Ge, SiGe, and/or a III-V semiconductor. Substrate 100 may already have pre-built structures (not shown) such as transistors, diodes, capacitors, resistors, interconnects, wiring, etc. The first fin 102 and the second fin 104 may be previously formed from the bulk substrate 100 through patterning and removal (e.g., sidewall image transfer) and/or deposition techniques (e.g., epitaxial growth). STI layer 110 may be any suitable dielectric capable of isolation of the first fin 102 and the second fin 104 such as, for example, silicon oxides, silicon nitrides, silicon oxynitrides.

Referring to FIG. 2a-2d, a gate dielectric layer 120, an etch stop layer 130, and a dummy gate layer 140 may be deposited. The gate dielectric layer 120 may be a high-k material, including but not limited to metal oxides such as hafnium oxide (e.g., $HfO_2$), hafnium silicon oxide (e.g., $HfSiO_4$), hafnium silicon oxynitride ($HfSix O_y N_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride (ZrSixOyNz), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k dielectric material may further include dopants such as lanthanum and/or aluminum. The stoichiometry of the high-k dielectric material may vary. A process such as CVD, ALD or PVD can be employed to deposit gate dielectric layer 120. According to an exemplary embodiment, gate dielectric layer 120 has a thickness of from about 1 nanometer (nm) to about 5 nm and ranges therebetween.

An etch stop layer 130 may be deposited. Etch stop layer 130 may be any material capable of protecting the underlying gate dielectric layer 120 during etching process occurring above the etch stop layer 130. For example, the material of the etch stop layer 130 may be TiN. The etch stop layer 130 may be deposited using a process such as CVD, ALD or PVD.

The dummy gate layer 140 may be deposited on the etch stop layer 130. In such embodiments, the dummy gate layer 140 may be made of any suitable sacrificial material, for example, amorphous or polycrystalline silicon. The dummy gate layer 140 may be deposited by any suitable deposition technique known in the art, including atomic layer deposition (ALD), chemical vapor deposition (CVD), physical vapor deposition (PVD), molecular beam deposition (MBD), pulsed laser deposition (PLD), or liquid source misted chemical deposition (LSMCD).

Referring to FIG. 3a-3d, a gate may be patterned into the dummy gate layer 140, forming a dummy inner gate 145 and an inner gate hardmask 150. A hardmask layer (not shown) may be formed using ALD deposition. The hardmask layer may be formed from, for example, Titanium Nitride or Silicon Nitride. Formation of the dummy inner gate 145 and an inner gate hardmask 150 may be accomplished by lithographic patterning of the regions, and subsequently etching away the dummy gate layer 140 and hardmask layer from the unpatterned areas. Following patterning and removal the dummy inner gate 145 and an inner gate hardmask 150 are formed from the dummy gate layer 140 and the hardmask layer. Patterning may be accomplished by depositing a lithographic material (e.g., a photoresist) and exposing the material with a suitable wavelength of light, according to the desired pattern. Etching may be performed to remove material not beneath the patterned lithographic material using any suitable technique, such as, for example, reactive ion etching (RIE) or wet stripping. The pattern for dummy inner gate 145 may create a structure having a width of about 10 to about 20 nm.

Referring to FIG. 4a-4d, a dummy outer gate layer 160 may be formed. Dummy outer gate layer 160 may be formed by a conformal deposition on the surface of the structure of FIG. 3a-3d. The dummy outer gate layer 160 may be made of any suitable sacrificial material capable of being selectively etched with respect to dummy inner gate 145 such as, for example, SiGe. The thickness of the deposition of the dummy outer gate layer 160 may correspond to the final width of first work function metal 225 (discussed below with respect to FIG. 12a-12D). The dummy outer gate layer 160 may be deposited having a thickness of about 3 to about 5 nm.

Referring to FIG. 5a-5d, a dummy outer gate 162 may be formed from the dummy gate layer 160. Formation of dummy outer gate 162 may be accomplished by removing unwanted material from dummy outer gate layer 160 the using an anisotropic etching process such as, for example, reactive ion etching (RIE) or plasma etching. Additionally, inner gate hardmask 150 and dummy outer gate 162 may act as a mask for gate dielectric layer 120 and etch stop layer 130, thereby creating etch stop 132 and gate dielectric 122 in the gate region of the device.

Referring to FIG. 6a-6d, planarizing material 170 may be deposited an outer gate hardmask 180 may be formed above the dummy outer gate. A planarizing material 170 such as, for example, an organic planarizing layer (OPL) material may be deposited onto substrate 100 and recessed to a height at or beneath the dummy outer gate 162. A casting process such as spin coating or spray casting can be employed to deposit the planarizing material 170 onto the structure of FIG. 5*a*-5*d*. A directional (anisotropic) etching process such as RIE can be used to recess the planarizing material 170 to the desired height. The outer gate hardmask 180 may be formed by conformal deposition of a hardmask material, followed by removing unwanted material from the conformal layer using an anisotropic etching process such as, for example, reactive ion etching (RIE) or plasma etching. The outer gate hardmask 180 may be made of any suitable masking material such as, for example, silicon nitride.

Referring to FIG. 7*a*-7*d*, the planarizing material 170 may be removed and a gate spacer 190 may be formed. By way of example only, an OPL planarizing material 170 may be removed using a process such as ashing. Spacers 190 may be formed adjacent to the dummy outer gate 162 and an outer gate hardmask 180. The spacers 190 may be made of any insulating material, such as silicon nitride, silicon oxide, silicon oxynitrides, high-k dielectrics (such as those listed above) or a combination thereof, and may have a thickness ranging from 2 nm to approximately 100 nm, preferably approximately 2 nm to approximately 25 nm. The spacers 190 may be formed by any method known in the art, including depositing a conformal dielectric layer over the structure depicted in FIG. 6*a*-6*d* and removing unwanted material using an anisotropic etching process such as, for example, reactive ion etching (RIE) or plasma etching. Methods of forming spacers are well-known in the art and other methods are explicitly contemplated. Further, in various embodiments, the spacers 190 may include one or more layers. While the spacers 190 are herein described in the plural, the spacers 190 may be a single spacer surrounding each gate structure.

Referring to FIG. 8*a*-8*d*, source/drain (S/D) 200 may be formed in a source/drain region of the first fin 102 and the second fin 104 and ILD 210 may be formed above S/D 200 and planarized. The S/D 200 may result a semiconductor material epitaxially grown on the exposed source/drain region of first fin 102 and second fin 104 and annealed. In an example embodiment of a p-FET, the semiconductor material may be silicon-germanium. In such an embodiment, a p-type semiconductor material may contain, for example, approximately 20% to approximately 100% germanium, approximately 0% to approximately 80% silicon, and may be doped with p-type dopants such as boron in concentrations ranging from approximately $1\times10^{20}$ atoms/cm$^3$ to approximately $2\times10^{21}$ atoms/cm$^3$. In another example embodiment of an n-FET, the semiconductor material may be carbon doped silicon. In such an embodiment, the n-type semiconductor material may contain, for example, approximately 0.5% to approximately 2.5% carbon, approximately 97.5% to approximately 99.5% silicon, and may be doped with n-type dopants such as arsenic or phosphorus in concentrations ranging from approximately $1\times10^{20}$ atoms/cm$^3$ to approximately $2\times10^{21}$ atoms/cm$^3$.

Referring to FIG. 9*a*-9*d*, dummy outer gate 162 may be exposed using CMP. During CMP, the height of the structure of FIG. 9*a*-9*d* may be reduced to remove outer gate hardmask 180, and thereby reducing the total height of the structure and exposing a top surface of the dummy outer gate 162.

Referring to FIG. 10*a*-10*d*, the dummy outer gate 162 may be selectively removed with respect to dummy inner gate 145. Any suitable method capable of selectively removing dummy outer gate 162 with respect to dummy inner gate 145 may be used.

Referring to FIG. 11*a*-11*d*, the etch stop 132 that was previously located beneath the dummy outer gate 160 may be removed, forming etch stop 134 located only beneath dummy inner gate 145. Etch stop 132 may be removed using, for example, RIE.

Referring to FIG. 12*a*-12*d*, a first workfunction metal 220 may be deposited in the void created by removing the outer dummy gate from FIG. 11*a*-11*d*. In forming the first workfunction metal 220, one or more layers of suitable workfunction metals may be deposited using a process such as CVD, ALD or PVD. Following deposition, the metal overburden can be removed using a process such as CMP. Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents.

In an example n-FET embodiment, the first workfunction metal 220 may be a layered stack of TiN/Al-containing alloy/TiN. In such an embodiment, the thickness of the bottom TiN may be about 0.5 to about 1.0 nm, the thickness of the Al-containing alloy may be about 0.5 to about 3.0 nm, and TiN may fill the rest of the cavity. In an example p-FET embodiment, the first workfunction metal 220 may be TiN.

Referring to FIG. 13*a*-13*d*, the dummy inner gate 145 and etch stop 134 may be removed. For example, anisotropic etch, such as a RIE, may be used to remove the dummy inner gate 145 and the etch stop 134.

Referring to FIG. 14*a*-14*d*, a second work function metal 240 may be deposited with a sacrificial cap 230 located above. A second workfunction metal 240 may be deposited in the void created by removing the outer dummy gate from FIG. 11*a*-11*d*. In forming the second workfunction metal 240, one or more layers of suitable workfunction metals may be deposited using a process such as CVD, ALD or PVD. Following deposition, the metal overburden can be removed using a process such as CMP. Suitable n-type workfunction metals include, but are not limited to, titanium nitride (TiN), tantalum nitride (TaN) and/or aluminum (Al)-containing alloys such as titanium aluminide (TiAl), titanium aluminum nitride (TiAlN), titanium aluminum carbide (TiAlC), tantalum aluminide (TaAl), tantalum aluminum nitride (TaAlN), and/or tantalum aluminum carbide (TaAlC). Suitable p-type workfunction-setting metals include, but are not limited to, TiN, TaN, and/or tungsten (W). TiN and TaN are relatively thick (e.g., greater than about 2 nm) when used as p-type workfunction-setting metals. However, very thin TiN or TaN layers (e.g., less than about 2 nm) may also be used beneath Al-containing alloys in n-type workfunction-setting stacks to improve electrical properties such as gate leakage currents. Following deposition of a sacrificial cap 230 may be formed above the gate region. Following the formation of the depicted structure, additional techniques, such as forming electrical connections to S/D 200 and the gate, as well as other back end of the line (BEOL) techniques may be performed.

In an example n-FET embodiment, the second workfunction metal 240 may be a layered stack of TiN/Al-containing alloy/TiN. In such an embodiment, the thickness of the bottom TiN may be about 1.0 to about 3.0 nm, the thickness of the Al-containing alloy may be about 0.5 to about 5.0 nm, and TiN may fill the rest of the cavity. In such an embodiment, the thickness of the bottom TiN layer of the second workfunction metal 240 may be larger than the thickness of the bottom TiN of the first workfunction metal 220. In an example p-FET embodiment, the second workfunction metal 240 may be a layered stack of TiN/Al-containing alloy/TiN. In such an embodiment, the thickness of the bottom TiN may be about 3.0 to about 5.0 nm, the thickness of the Al-containing alloy may be about 0.5 to about 5.0 nm, and TiN may fill the rest of the cavity.

Figure 15:
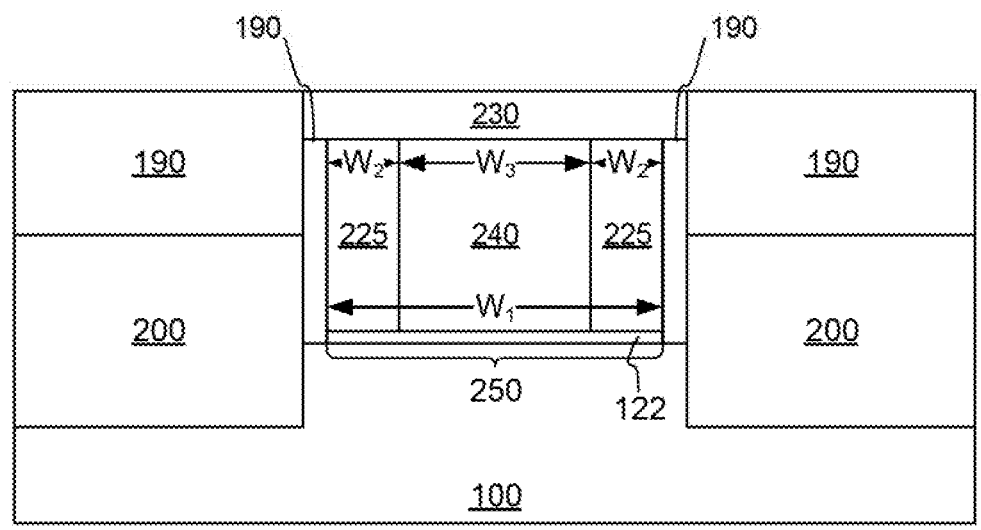
FIG. 15 depicts a cross-sectional view along the $Y_1$ axis of FIG. 14a containing dimensional markings of the FET gate structure, according to an example embodiment.

Following the process outlined above, the structure of FIG. 15 may be created. FIG. 15 depicts a gate region 250 on a substrate 100. The gate region may contain a first workfunction metal 225 and a second work function metal 240 above a gate dielectric 122 located in contact with the first fin 102. A second workfunction metal 240 may be approximately centered over the gate dielectric 122 and may be located on both sides by a first workfunction metal 225. The overall width W1 of the workfunction metals may be about 15 to about 20 nm. The second workfunction metal 240 may have a width W3 of about 5 to about 10 nm. The first workfunction metal 225 may have a width W2 of about 3 to about 5 nm. In such an embodiment, the width W3 of the second workfunction metal 240 may be about 50 to about 75% of the overall width W1 of the workfunction metals. In such an embodiment, the width W2 of the first workfunction metal 225 may be about 25 to about 50% of the overall width W1 of the workfunction metals. Spacers 190 may be located adjacent to the first workfunction metal 225, and between the first workfunction metal 225 and the S/D 200.

Figure 16:
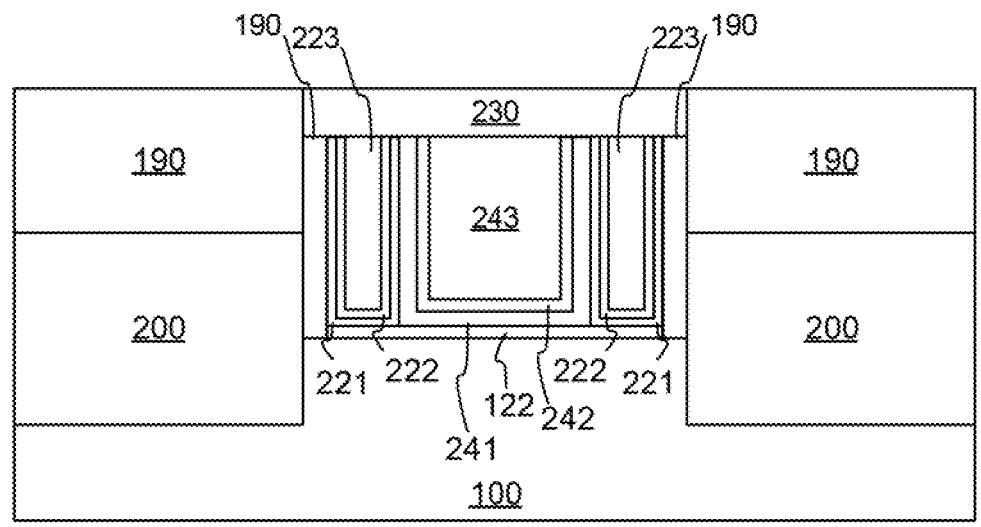
FIG. 16 depicts an embodiment of FIG. 15 using nFET workfunction metals, according to an example embodiment.
Figure 17:
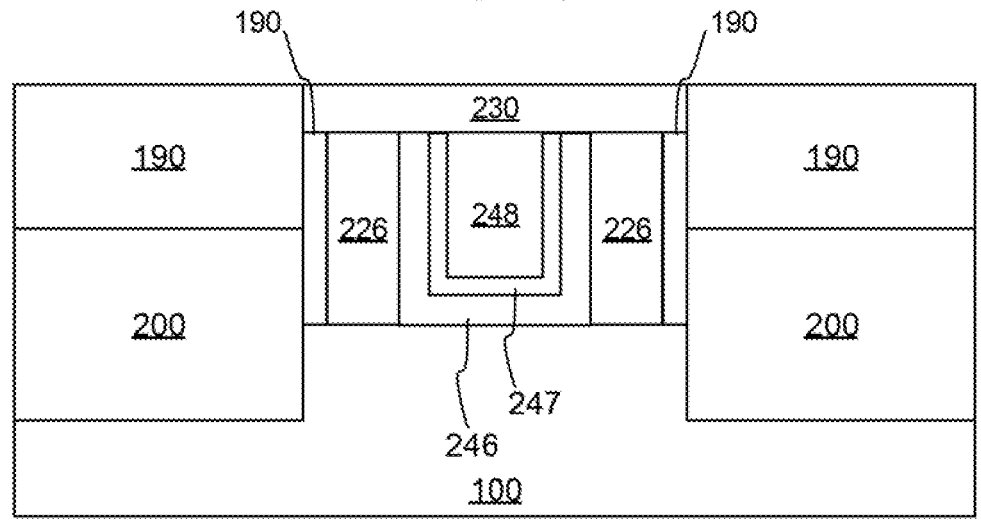
FIG. 17 depicts an embodiment of FIG. 15 using pFET workfunction metals, according to an example embodiment.

Referring to FIG. 16, depicted is an embodiment of the structure of FIG. 15 having n-FET workfunction metals discussed above. In the depicted embodiment, first workfunction metal 225 contains the first layer 221 of the first workfuncion metal 225, the second layer 222 of the first workfuncion metal 225, and the third layer 223 of the first workfuncion metal 225. As used herein, thickness of a layer is defined as the distance between the adjacent layers of the layer (e.g., the thickness of the first layer is the distance between the gate dielectric 122 and the second layer 222). The first layer 221 may include TiN and the thickness may be about 0.5 to about 1.0 nm. The second layer 222 may in an Al-containing alloy and the thickness may be about 0.5 to about 3.0 nm. The third layer 223 may include TiN. In the depicted embodiment, second workfunction metal 240 contains the first layer 241 of the second workfunction metal 240, the second layer 242 of the second workfunction metal 240, and the third layer 243 of the second workfunction metal 240. The first layer 241 may include TiN and the thickness may be about 1.0 to about 3.0 nm. The second layer 242 may in an Al-containing alloy and the thickness may be about 0.5 to about 5.0 nm. The third layer 243 may include TiN. In such emodiments, the first layer 241 of the second workfunction metal 240 may be thicker than the first layer 221 of the first workfunction metal 220. Additionally, while FIG. 16 depicts a u-shaped workfunction layer due to the conformal deposition, other geometries are contemplated having the thicknesses described above.

Referring to FIG. 16, depicted is an embodiment of the structure of FIG. 15 having n-FET workfunction metals discussed above. In the depicted embodiment, first workfunction metal 225 is depicted as outer nFET workfunction metal 226. In this embodiment, outer nFET workfunction metal 226 may include TiN. In the depicted embodiment, second workfunction metal 240 contains the first layer 241 of the second workfunction metal 240, the second layer 242 of the second workfunction metal 240, and the third layer 243 of the second workfunction metal 240. The first layer 241 may include TiN and the thickness may be about 0.5 to about 1.0 nm. The second layer 242 may in an Al-containing alloy and the thickness may be about 0.5 to about 3.0 nm. The third layer 243 may include TiN. In such emodiments, the first layer 241 of the second workfunction metal 240 may be thicker than the first layer 221 of the first workfunction metal 220. Additionally, while FIG. 16 depicts a u-shaped workfunction layer due to the conformal deposition, other geometries are contemplated having the thicknesses described above.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein. It is therefore intended that the present invention not be limited to the exact forms and details described and illustrated but fall within the scope of the appended claims.

What is claimed is:

1. A semiconductor structure comprising:
   a gate dielectric located on a substrate, wherein the gate dielectric defines a gate region of the substrate;
   a first work function metal located on a first portion of the gate dielectric; and
   a second work function metal located on a second portion of the gate dielectric, wherein the first work function metal comprises two distinct portions separated by the second work function metal,
   wherein the first work function metal comprises a bottom layer comprising TiN, an intermediate layer comprising an Al-containing alloy, and a top layer comprising TiN, and wherein the second work function metal comprises a bottom layer comprising TiN, an intermediate layer comprising an Al-containing alloy, and a top layer comprising TiN.

2. The structure of claim 1, wherein a bottom surface of the first work function metal is substantially flush with a bottom surface of the second work function metal.

3. The structure of claim 1, wherein a top surface of the first work function metal is substantially flush with a top surface of the second work function metal.

4. The structure of claim 1, wherein a vertical sidewall of the first work function metal contacts a vertical sidewall of a gate spacer.

5. The structure of claim 1, further comprising:
   a dielectric cap in direct contact with and covering top surfaces of both the first work function metal and the second work function metal.

6. The structure of claim 1, wherein a width of one portion of the first work function metal is about 3.0 to about 5.0 nm.

7. The structure of claim 1, wherein a width of one portion the first work function metal is about 25% to about 50% of a width of the gate region.

8. The structure of claim 1, wherein a thickness of the bottom layer of the second work function metal is greater than a thickness of the bottom layer of the first work function metal.

9. The structure of claim 1, wherein uppermost surfaces of the bottom layer, the intermediate layer, and the top layer of the first work function metal are substantially flush with one another, and wherein uppermost surfaces of the bottom layer, the intermediate layer, and the top layer of the second work function metal are substantially flush with one another.

10. The structure of claim 1, wherein the top layer of the first work function metal is surrounded on at least three sides by the intermediate layer of the first work function metal, and the intermediate layer of the first work function metal is surrounded on at least three sides by the bottom layer of the first work function metal, and wherein the top layer of the second work function metal is surrounded on at least three sides by the intermediate layer of the second work function metal, and the intermediate layer of the second work function metal is surrounded on at least three sides by the bottom layer of the second work function metal.

11. A semiconductor structure comprising:
 a gate dielectric located on a substrate, wherein the gate dielectric defines a gate region of the substrate;
 a first work function metal located on a first portion of the gate dielectric; and
 a second work function metal located on a second portion of the gate dielectric, wherein the first work function metal comprises a first portion distinct and separated from a second portion by the second work function metal,
 wherein the first work function metal comprises a bottom layer comprising TiN, an intermediate layer comprising an Al-containing alloy, and a top layer comprising TiN, and wherein the second work function metal comprises a bottom layer comprising TiN, an intermediate layer comprising an Al-containing alloy, and a top layer comprising TiN.

12. The structure of claim 11, wherein a bottom surface of the first work function metal is substantially flush with a bottom surface of the second work function metal.

13. The structure of claim 11, wherein a top surface of the first work function metal is substantially flush with a top surface of the second work function metal.

14. The structure of claim 11, wherein a vertical sidewall of the first work function metal contacts a vertical sidewall of a gate spacer.

15. The structure of claim 11, further comprising:
 a dielectric cap in direct contact with and covering top surfaces of both the first work function metal and the second work function metal.

16. The structure of claim 11, wherein a width of one portion of the first work function metal is about 3.0 to about 5.0 nm.

17. The structure of claim 11, wherein a width of one portion the first work function metal is about 25% to about 50% of a width of the gate region.

18. The structure of claim 11, wherein a thickness of the bottom layer of the second work function metal is greater than a thickness of the bottom layer of the first work function metal.

19. The structure of claim 11, wherein uppermost surfaces of the bottom layer, the intermediate layer, and the top layer of the first work function metal are substantially flush with one another, and wherein uppermost surfaces of the bottom layer, the intermediate layer, and the top layer of the second work function metal are substantially flush with one another.

20. The structure of claim 11, wherein the top layer of the first work function metal is surrounded on at least three sides by the intermediate layer of the first work function metal, and the intermediate layer of the first work function metal is surrounded on at least three sides by the bottom layer of the first work function metal, and wherein the top layer of the second work function metal is surrounded on at least three sides by the intermediate layer of the second work function metal, and the intermediate layer of the second work function metal is surrounded on at least three sides by the bottom layer of the second work function metal.

\* \* \* \* \*